United States Patent [19]

Hertz et al.

[11] Patent Number: 5,356,658

[45] Date of Patent: Oct. 18, 1994

[54] FLEXIBLE HIGH SPEED LIQUID DISPENSER

[75] Inventors: Allen D. Hertz, Boca Raton; Henry F. Liebman, Tamarac; Frank C. Immacolato, Boca Raton, all of Fla.

[73] Assignee: Motorola, Inc., Schaumburg, Ill.

[21] Appl. No.: 92,858

[22] Filed: Jul. 19, 1993

[51] Int. Cl.⁵ .............................................. B05D 1/00
[52] U.S. Cl. ........................................ 427/96; 427/97; 427/282
[58] Field of Search ........................... 427/282, 97, 96

[56] References Cited

U.S. PATENT DOCUMENTS

| | | | |
|---|---|---|---|
| 4,301,192 | 11/1981 | Plichta | 427/282 |
| 4,529,477 | 7/1985 | Lundberg | 427/97 |
| 4,964,948 | 10/1990 | Reed | 427/97 |
| 5,080,929 | 1/1992 | Zachman | 427/96 |
| 5,159,171 | 10/1992 | Cook et al. | 219/121.63 |
| 5,211,328 | 5/1993 | Ameen | 427/96 |

*Primary Examiner*—Shrive Beck
*Assistant Examiner*—Vi Duong Dang
*Attorney, Agent, or Firm*—M. Mansour Ghomeshi

[57] ABSTRACT

The method for dispensing liquid on a substrate includes providing a plate (108) having a plurality apertures (110). These apertures (110) conform to the pattern of a plurality of pads (104, 106) of at least one component of a substrate (102). The apertures (110) are filled with the liquid to be dispensed, and are then aligned with the plurality of pads (104, 106) on the substrate (102). The liquid is simultaneously transferred out of the apertures (110) and onto the plurality of pads (104, 106) using a blower (112).

13 Claims, 3 Drawing Sheets

FLEXIBLE HIGH SPEED LIQUID DISPENSER

FIELD OF THE INVENTION

This invention is related in general to liquid dispensing equipment and more particularly to epoxy dispensing equipment.

BACKGROUND

An important factor in designing an automated assembly line for populating printed circuit boards is speed. Several of the components of such an assembly line have been upgraded to enjoy the most recent technologies in robotics to achieve high speed production. Yet other components, such as the solder flux and solder paste dispensing machines have notoriously been slow. The slow operation of these machines governs the overall speed of the assembly line and hence limits their production capacity. Some solder flux/paste dispensing machines employ stencils whereby solder paste or solder flux is deposited on a particular printed circuit board utilizing the stencil. Although the application of the paste/flux is fairly rapid with the stencil, the time required for an operator to change stencil as boards entering the assembly line change, places a significant burden on the overall operation of the line. A technique to eliminate stencil utilizes a single dot needle dispensing machine where solder paste/flux is deposited on the pads of a PC board individually. As can be imagined, this process is highly time consuming and requires periodical cleaning and/or replacement of the needle. As can be seen, the present technologies available to deposit solder flux/paste on a printed circuit board are either too slow or require extensive human interaction. It is therefore desired to provide a solder flux/paste dispensing apparatus to overcome the deficiencies of the prior art.

SUMMARY OF INVENTION

Briefly, according to the present invention a method of dispensing liquid on a substrate is disclosed. The method includes providing a plate having a plurality of apertures. These apertures conform to the pattern of the plurality of pads of at least one component on the substrate. These apertures are filled with a liquid that is desired to be dispensed on the substrate. The plate is then moved so that the apertures may be aligned with the plurality of pads. Finally, the liquid is transferred out of the apertures and onto the plurality of pads on the substrate using a blower.

In other aspects of the present invention an apparatus for dispensing liquid on a circuit carrying substrate is disclosed. The apparatus includes a plate which is placed substantially in parallel with the substrate. The plate includes a plurality of apertures which conform to the pattern of the pads of at least one component on the substrate. The apparatus includes a means for dispensing liquid in the plurality of apertures. The apparatus further includes means for blowing air through the plurality of apertures in order to simultaneously transfer the liquid out of the apertures and onto the pads.

DETAILED DESCRIPTION OF THE PREFERRED EMBODIMENT

Figure 1:
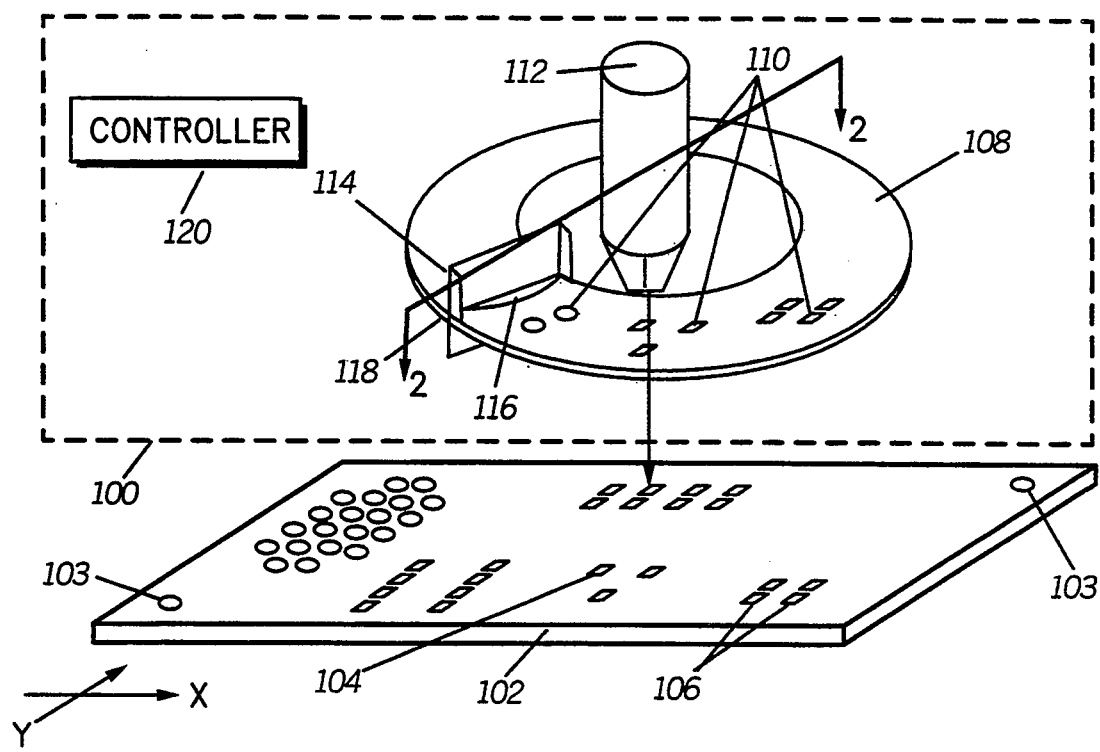
FIG. 1 shows an apparatus for dispensing liquid on a substrate in accordance with present invention.

Referring to FIG. 1, a liquid dispensing apparatus 100 in accordance with the present invention is shown. The apparatus 100 locates a circuit carrying substrate, such as the printed circuit board 102. The circuit board 102, includes pads 104 and 106 that conform to a variety of components. The apparatus 100 includes a plate 108 in which there are a number of apertures 110. These apertures 110 conform to the pattern of the pads of various components, such as 104 and 106. The apertures 110 may be formed using a meshing technique or they may simply be open apertures. The circuit board 102 is placed substantially in parallel with the plate 108. The circuit board 102 includes locating features 103. The locating features 103 may be fiducials or tooling pins. Other methods of aligning the board 102 to the system 100 may use an X-Y table. The X-Y table or the locating pins 103 provide for the alignment of the board 102 to the system 100. This alignment allows the controller 120 to know the exact location of the board 102 and hence the pads 104 and 106. With this information, the controller 120 may direct various components of the system 100 to appropriate locations on the X-Y table in order to dispense liquid on the board 102. A reservoir 116 is used to hold the liquid to be dispensed on the board 102. A blower 112, is used to blow air through the apertures to deposit the liquid onto the pads 104 and 106. Other gases such as Nitrogen may be used to provide additional benefits such as inhibiting oxidation. Those skilled in the art appreciate a variety of other gases to accomplish various objectives. In the preferred embodiment, air is used for its additional safety and its abundance. Two blades 114 and 118 are used to wipe excess liquid off the plate. It is noted that as plate 108 turns, the entire plate is filled with the liquid 116. The surface tension of the liquid 116 prevents the it from departing the apertures and hence there is no need to provide for a mechanism to contain the liquid. It is understood that the apparatus 100 includes mounting mechanism to keep the various components together. These supporting components have not been shown here in order to simplify the diagram.

Figure 2:
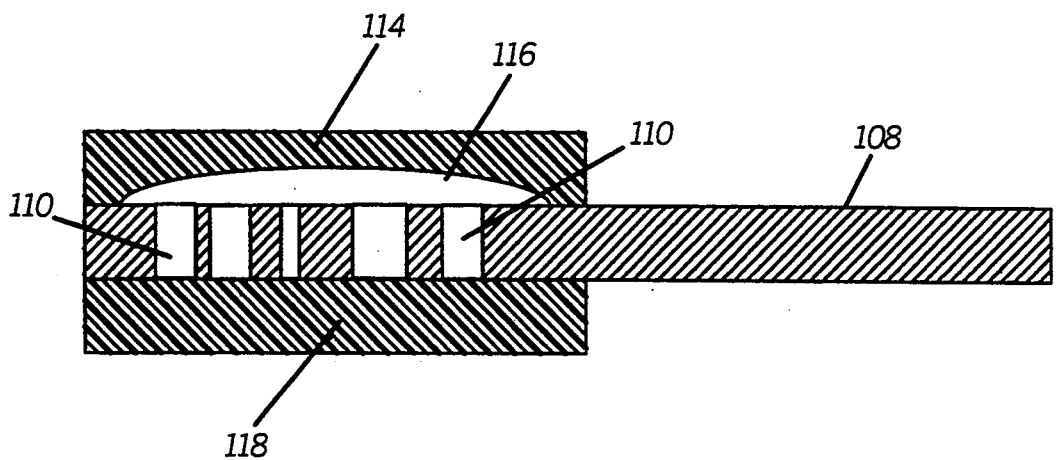
FIG. 2 shows a cross-sectional view of a portion of the apparatus of FIG. 1.

FIG. 2, shows a cross-sectional view of plate 108, in this diagram the blades 114 and 118 are shown touching the plate 108. The apertures 110 are also seen filled with a liquid 116. The top plate 114 may include side walls to entrap the liquid 116. In place of side walls on the blade 114 one could add side walls to the plate 108 to achieve the same objective. In addition, the top blade 114 may be inclusive of a reservoir for holding and dispensing liquid. This reduces the number of times the liquid 116 must be added to the plate 108.

Although the plate 108 is shown to have a uniform thickness, it is understood that plates with non-uniform thickness may be used. The thickness of the plate 108 will determine the amount of liquid that can be stored in the apertures 110 and hence dispensed on the board 102. The thicker the plate the more liquid and hence the larger the pad that may be accommodated. By varying the thickness of the plate 108 in various areas, the commonalty of the plate may be maintained for various printed circuit boards. Another benefit of a variable thickness plate is that the volume of liquid 116 may be adjusted without changing the surface area of the apertures 110.

It can be appreciated that by having the plate 108 turn independent of the blower 112, the speed of the dispensing liquid is enhanced. This is primarily because the two steps are totally independent and occur in parallel. It is noted that with this mechanism an accurate amount of liquid can be dispensed on printed circuit boards without significant cost. Since the size of the aperture 110 and the thickness of the plate 108 is what determines the amount of liquid, this amount can remain constant for repeated use.

Figure 3:
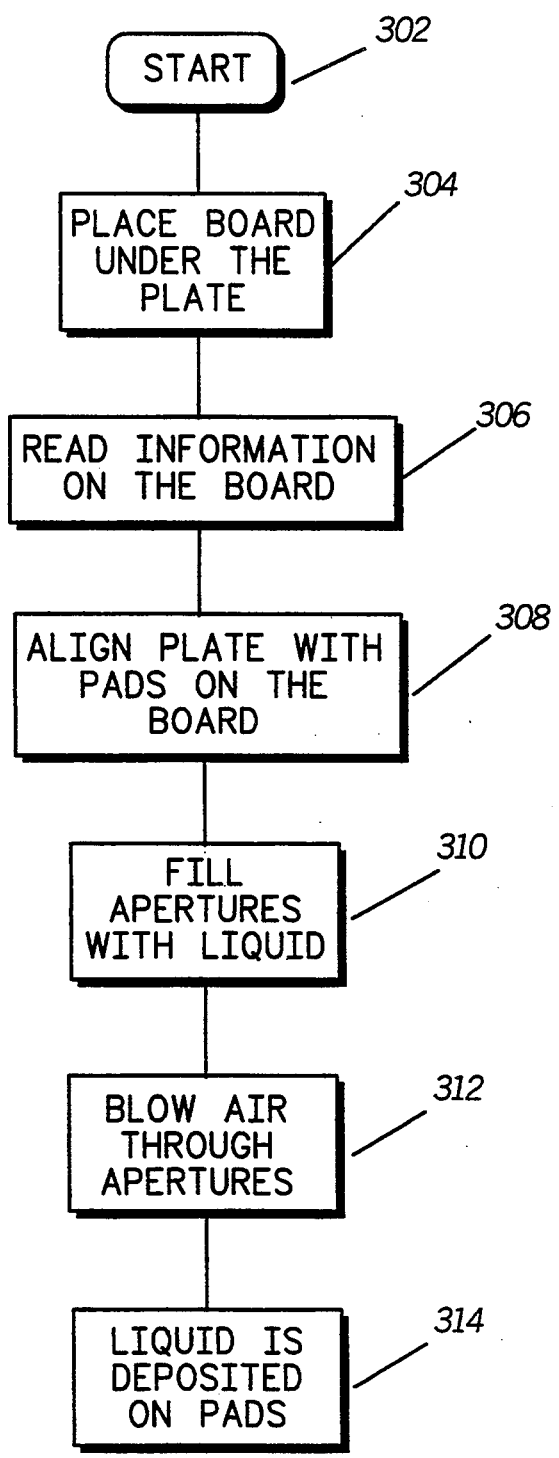
FIG. 3 shows a flow diagram in accordance with the present invention.

Referring to FIG. 3, a flow diagram of the operation of the apparatus 100 is shown. From a start block 302, the circuit carrying substrate 102 is attached to the X-Y table substantially in parallel with the plate 108, block 304. Then the information and the type and pattern of the pads on the board 102 are retrieved from a data bank, block 306. This information is manipulated by controller 120 and is used to turn the plate 108 to the appropriate location of the pads to be deposited with liquid. The plate 108 is then aligned with the pads 104 via the X-Y table and the rotation of the plate 108, block 308. As the plate 108 turns, the apertures 110 are filled with the liquid. The excess liquid is wiped off the plate 108 with the blades 114 and 118, block 310. Next, the controller 120 may move the blower 112 until the blower is located substantially in line with the apertures 110. Next, the blower 112 may be raised or lowered to adjust the area covered by the air blow. This varies the number of pads that may be dispensed with liquid with a single air blow. The pressure of the air blow is adjusted in accordance with its height. At this time the blower blows air through the apertures, block 312. The air pushes the liquid out of the apertures 110 and deposits it on the pads 104, block 314. Using this mechanism, it could be seen that a number of pads may be deposited with liquid simultaneously. This significantly speeds up the process of dispensing epoxy or other liquids such as solder flux or solder paste on a printed circuit board. It is noted that the nozzle on the air blower 112 can be of various sizes to accommodate a variety of patterns. The larger the nozzle, the larger the area of the apertures that can be blown at simultaneously. Following block 314 the operation is repeated in order to deposit liquid on a next batch of pads.

In the preferred embodiment the plate 108 provides for the aligning of the apertures in the X direction. The blower 112 provides movement in the Y and Z directions. It can be appreciated that the plate 108 may include multiple patterns that conform to the same pattern of pads. The additional patterns reduce the time the plate 108 must turn in order to get to a desired pattern. This results in an increased speed of the dispensing of the liquid 116.

Figure 4:
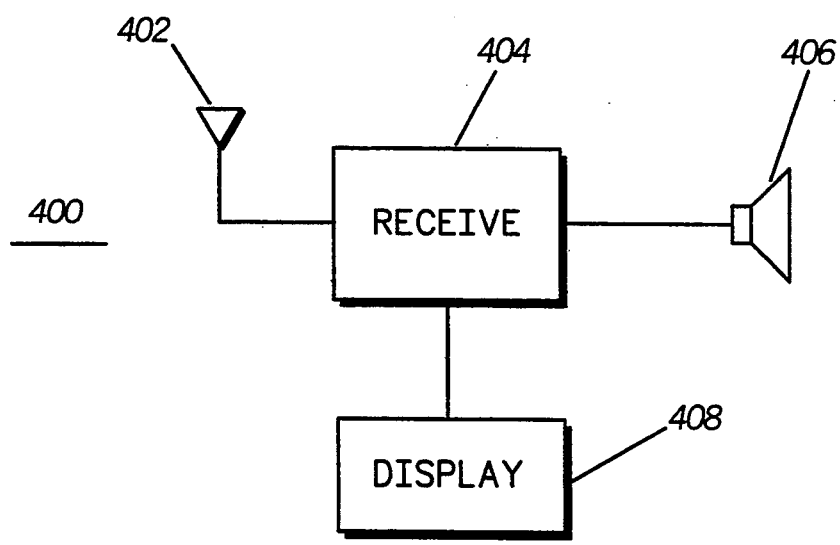
FIG. 4 is a block diagram of a communication device in accordance with the present invention.

Referring to FIG. 4, a communication device 400 in accordance with the present invention is shown. The communication device 400 includes an antenna 402, which is used to receive radio frequency signals. The signals are coupled to a receiver 404 where they are demodulated and applied to a speaker 406 or a display 408 depending on the nature of the demodulated information. The receiver 404 includes a circuit carrying substrate similar to the circuit carrying substrate 102. The circuit carrying substrate 102 is deposited with solder flux in accordance with the present invention.

It can be seen that by using the apparatus 100, a circuit carrying substrate may be deposited with solder paste or solder flux or any other liquid in bulk. In other words, solder flux or other liquids may be deposited on a number of pads on the circuit carrying substrate simultaneously. By allowing the apertures 110 to conform to the pads of a particular component, the pads for a component may be deposited with solder flux simultaneously speeding the process. In addition to the speed, this assists with maintaining a common plate for a variety of circuit carrying substrate. When the apparatus 100 is utilized in an automated assembly system, various PC boards may be inserted into the apparatus without having to change the plate 108. This is because the plate 108 includes apertures that conform to pads on the board and not necessarily to individual printed circuit boards. Since pads for components are common in different printed circuit boards the location of pads corresponding to various components is communicated to the controller 120 and plate 108. With this location information available to the apparatus 100, solder flux and other liquids may be dispensed with higher speed. Furthermore, this eliminates the need to change plates as printed circuit boards are changed. This is a significant benefit over the use of a stencil which has to be changed whenever a new circuit carrying substrate is presented. The step of cleaning and washing the stencil is also eliminated when the teachings of the present invention are incorporated.

Another benefits of the present invention, in addition to its high speed, is that no hard tooling for any printed circuit board is necessary, as the entire system may be automated. This is provided through the use of the controller 120 which determine of the location of the pads simply by retrieving component location information from a data base. Yet, another benefit of the present invention is that the operation of the apparatus 100 is independent of the viscosity of the liquid being dispensed. To accommodate various viscosity levels, the pressure at the air blower 112 may be adjusted.

It can be seen that by employing the apparatus 100 a fully automated system for populating printed circuit boards may be fabricated. The process of dispensing solder flux/paste on printed circuit boards will no longer be the bottle neck of a printed circuit assembly process. By allowing the higher speed mechanism of the apparatus 100 to be incorporated in such an assembly printed circuit boards may be processed without operator interface and the time consuming processes that dispense liquid one dot at a time. With this process, multiple pads corresponding to a particular component are dispensed at the same time which significantly improve the speed and the independence of the process.

What is claimed is:

1. A method for dispensing liquid on a substrate, comprising the steps of:
   providing a circuit carrying substrate having a plurality of pads:
   providing a plate above the circuit carrying substrate, the plate having a plurality of apertures which conform to the pattern of the plurality of pads of at least one component on the circuit carrying substrate;
   providing liquid in the plurality of apertures;
   aligning the plurality of apertures with the plurality of pads; and transferring the liquid out of the plurality of apertures onto the plurality of pads substantially simultaneously.

2. The method of claim 1, wherein the step of transferring includes the step of blowing the liquid out of the plurality of apertures.

3. The method of claim 2, wherein the step of blowing includes the step of blowing air at the plurality of apertures.

4. The method of claim 1, wherein the step of providing liquid includes the step of providing epoxy.

5. The method of claim 1, wherein the step of providing liquid includes the step of providing solder flux.

6. The method of claim 1, wherein the step of providing liquid includes the step of providing solder paste.

7. The method of claim 1, wherein the step of providing a plate includes providing a plate having a variable thickness.

8. A method for providing liquid on the pads of a substrate, comprising the steps of:

providing a circuit carrying substrate having a plurality of pads which conform to the pattern of at least one multi pin component;

providing a plate above the circuit carrying substrate, the plate having a plurality of apertures which conform to the plurality of pads;

providing a liquid in the apertures;

moving the plate to substantially align the plurality of apertures with the plurality of pads; and blowing air through the plurality of apertures to substantially simultaneously transfer the liquid out of the apertures and onto the pads.

9. The method of claim 8, further including the step of removing excess liquid off the plate.

10. The method of claim 8, further including the step of retrieving information on the location of the pads from a data bank.

11. The method of claim 8, further including the step of locating an air blower over the apertures.

12. The method of claim 11, further including the step of aligning the air blower to substantially align the air blower to the plurality of apertures and the plurality of pads.

13. The method of claim 8, wherein the step of providing the liquid includes the step of dispensing solder flux in the plurality of apertures.

* * * * *